(12) United States Patent
Gruber et al.

(10) Patent No.: US 11,949,446 B2
(45) Date of Patent: Apr. 2, 2024

(54) TRANSFORMER, TRANSMITTER CIRCUIT, SEMICONDUCTOR CHIP, SEMICONDUCTOR PACKAGE, BASE STATION, MOBILE DEVICE, AND METHOD FOR A RADIO FREQUENCY TRANSMITTER

(71) Applicant: Intel Corporation, Santa Clara, CA (US)

(72) Inventors: Daniel Gruber, St. Andrae (AT); Mark Elzinga, Shingle Springs, CA (US); Martin Clara, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 74 days.

(21) Appl. No.: 16/912,741

(22) Filed: Jun. 26, 2020

(65) Prior Publication Data
US 2021/0409065 A1    Dec. 30, 2021

(51) Int. Cl.
| | | |
|---|---|---|
| *H04L 27/00* | (2006.01) | |
| *H01Q 1/24* | (2006.01) | |
| *H01Q 23/00* | (2006.01) | |
| *H04B 1/04* | (2006.01) | |
| *H04B 1/58* | (2006.01) | |

(52) U.S. Cl.
CPC ............. *H04B 1/582* (2013.01); *H01Q 1/246* (2013.01); *H01Q 23/00* (2013.01); *H04B 1/0475* (2013.01); *H04B 2001/0433* (2013.01)

(58) Field of Classification Search
CPC .................. H04B 1/582; H04B 1/0475; H04B 2001/0433; H01Q 1/246; H01Q 23/00
USPC ......................................................... 343/702
See application file for complete search history.

(56) References Cited

U.S. PATENT DOCUMENTS

| | | | |
|---|---|---|---|
| 2008/0242240 A1* | 10/2008 | Rofougaran | ........... H04B 1/406 455/73 |
| 2011/0249770 A1* | 10/2011 | Bellaouar | ............. H03F 1/0261 375/296 |
| 2011/0299431 A1 | 12/2011 | Mikhemar et al. | |
| 2012/0032739 A1* | 2/2012 | Peroulas | ................ H03F 1/3247 330/149 |
| 2012/0051099 A1* | 3/2012 | Funaba | ............ H03K 17/04123 363/21.17 |
| 2013/0337755 A1 | 12/2013 | Kim et al. | |
| 2014/0191800 A1 | 7/2014 | Jordan | |
| 2016/0315599 A1* | 10/2016 | Takeuchi | ............... H03H 11/18 |

* cited by examiner

*Primary Examiner* — Zewdu A Kassa
(74) *Attorney, Agent, or Firm* — 2SPL Patent Attorneys PartG mbB; Yong Beom Hwang

(57) ABSTRACT

The present disclosure relates to a concept for a transformer, a transmitter circuit, a semiconductor chip, a semiconductor package, a base station, a mobile device and a method for a radio frequency transmitter. The transformer for a radio frequency transmitter circuit comprises a primary coil and a secondary coils, which are configured to receive an input signal and to provide an output signal, and a ternary coil configured to provide a feedback signal.

26 Claims, 10 Drawing Sheets

TRANSFORMER, TRANSMITTER CIRCUIT, SEMICONDUCTOR CHIP, SEMICONDUCTOR PACKAGE, BASE STATION, MOBILE DEVICE, AND METHOD FOR A RADIO FREQUENCY TRANSMITTER

FIELD

The present disclosure generally relates to a transformer, a transmitter circuit, a semiconductor chip, a semiconductor package, a base station, a mobile device and a method for a radio frequency transmitter and, more particularly, to a concept for using a transformer with an additional coil in a transmitter circuit to determine a feedback signal as a basis for pre-distortion.

BACKGROUND

To improve the signal quality of wireless transmitters (TX), distortion produced by components such as digital-to-analog converters, mixers, radio frequency power amplifiers can be pre-compensated by digital signal processing in a digital baseband section of a transmitter. Pre-distortion can be based on a feedback signal that is probed or sampled in the transmitter path. In order to probe or sample such a signal, additional components are introduced into the transmission path or transmission processing chain and the additional components also take influence on the transmit signal, e.g. in terms of distortion, noise generation, and attenuation. It is therefore critical to properly dimension and select such probing components as they may take negative influence on the transmit signal.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
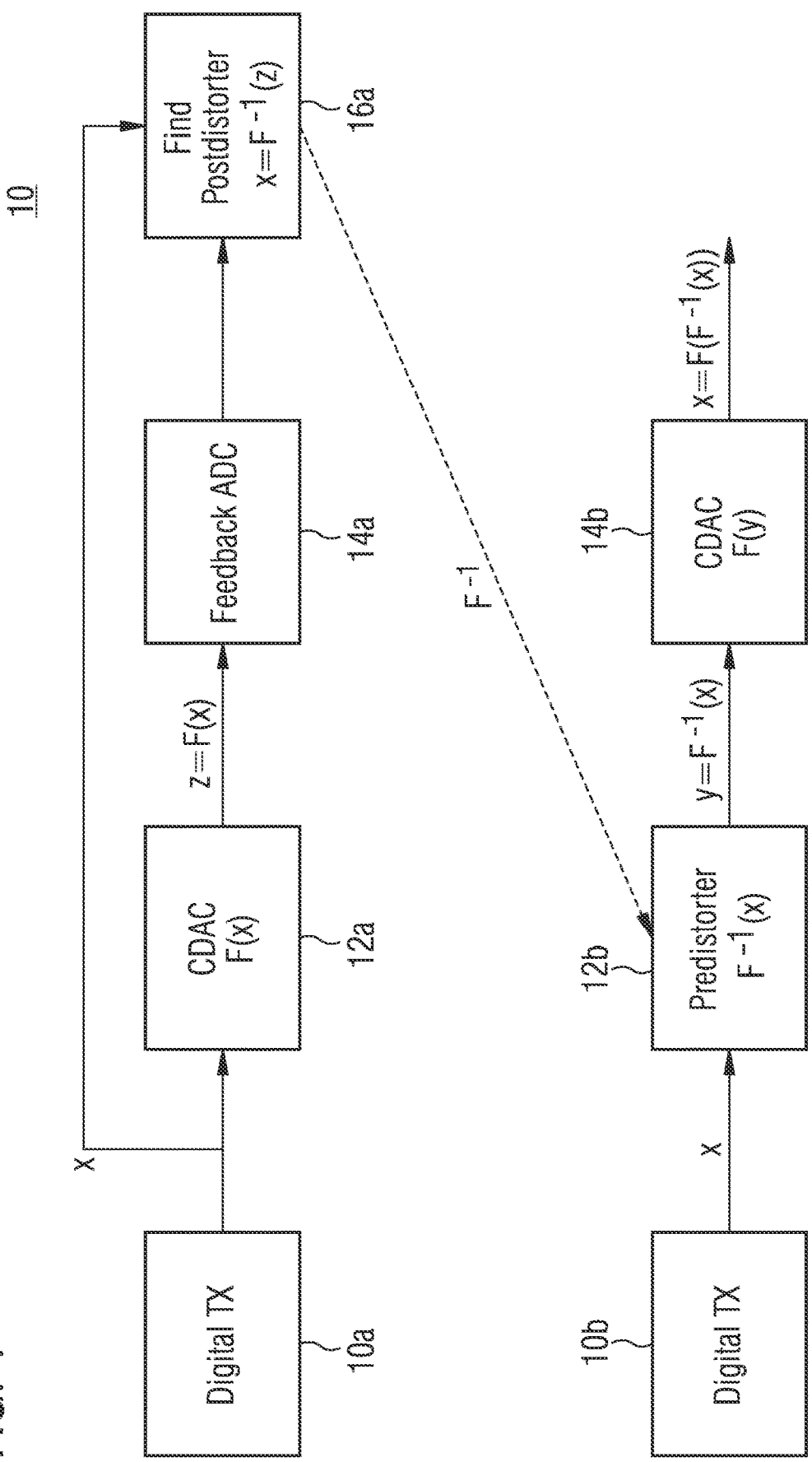
FIG. 1 shows a transmit feedback path utilizing an analog-to-digital converter to correct a transmit signal through predistortion controls.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an 'or', this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 shows a transmit feedback path of a transmitter circuit 10 utilizing an analog-to-digital converter (ADC) to correct a transmit signal through predistortion controls. FIG. 1 illustrates two different processing states of a transmitter (TX) circuit, one at the top and one at the bottom. Top and bottom half of FIG. 1 describe two different states of one and the same transmitter circuit with DPD (digital pre-distortion) assistance. The top half is the TX during DPD-identification, using the observation ADC and digital signal processing to find a suitable digital pre-distorter $F^{-1}(x)$. Once the pre-distorter is identified, it is then "placed" into the (digital) signal path before the nonlinear element (in this case a capacitive digital-to-analog converter (C-DAC)) to improve its performance during regular operation as shown in the bottom half of FIG. 1. The DPD-identification ("training") in the first phase (top half of FIG. 1) can either be done with a special training signal (preferred), or eventually also using the actual TX traffic signal (which may have disadvantages). Also, DPD-training could be done only at startup (with a special training signal), during regular or irregular intervals of the actual TX-operation (with either a predefined training sequence or using the actual TX traffic signal), or even all the time (adaptively), but then by definition it uses the actual TX traffic signal.

In both states a digital transmit generation block "Digital TX" 10a, 10b generates a digital transmit signal x. In the upper state the digital transmit signal is then converted into an analog signal using a capacitive digital-to-analog converter (CDAC) 12a. Since the CDAC 12a is imperfect, some distortion or signal modifications are applied to the input signal such that the output signal is distorted. If x(n) is the input of the CDAC 12a and z(n) its output, a (e.g. nonlinear) distortion of the CDAC output may be expressed as z(n)=F (x(n)).

As further shown in FIG. 1 the output of the CDAC 12a is then converted back into a digital signal using feedback ADC 14a. Both the original transmit signal x and the output of the feedback ADC 14a are provided to a postdistorter 16a, which finds a function that corrects or at least reduces the distortion in the output signal of the feedback ADC 14a. Ideally, such a function would be the inverse distortion function. A function that corrects the non-linearity and is applied to z(n), i.e. at the output of the feedback ADC 14a may be referred to as "post-distortion function". The post-distortion function would be such that $x(n)=F^{-1}(z(n))$, or equivalently $x(n)=F^{-1}(F(x(n)))$.

This function can then be used in the lower state of FIG. 1 in a pre-distorter 12b, which applies the function to the transmit signal and obtains $y(n)=F^{-1}(x(n))$, which is then converted to an analog signal using the CDAC 14b, which is the same as CDAC 12a with function F. Hence, CDAC outputs $x(n)=F^{-1}(F(x(n)))$. Under ideal assumptions the distortion is eliminated, under practical assumptions it is at least reduced.

FIG. 1 illustrates a technique that can provide both an offline, or on startup, and/or in-situ real time dynamic calibration for TX controls by observing the TX output, and then analyze the waveform with a precision ADC fully integrated in the design, such as the feedback loop shown in the FIG. 1. However, to observe the output of the TX without degrading the performance significantly is a major challenge. Any circuit that would be used for this purpose and added directly to the transmitter path could potentially degrade the insertion loss, or return loss, bandwidth, or other important metrics.

FIG. 1 illustrates an example, in which such a feedback loop uses signal probing or feedback after the CDAC 12a, 14b to compensate for the distortions evoked by the CDAC 14b. However, in further examples the feedback loop may be extended to include further processing or processing components in the transmit chain. For example, components in the radio signal or radio frequency part of the transmitter chain may be included. Examples of such components are mixers and power amplifiers. In further examples the signal z may be probed after mixing or even after power amplifying and then be fed back for predistortion.

In radio frequency (RF) transceivers, one technique to enable a power efficient transmitter is to utilize a transformer, such as a Guanella Balun or optionally other transformer types. Generally, a transmission-line transformer can be used, which is often called balun, which might not always follow exactly a correct use of terminology, if input and output are balanced (=fully differential signals). Such a transformer may serve two main functions:

1. Impedance match from a low impedance driver to a higher impedance load, and
2. Voltage step up, to provide higher power into a load For example, in wireless base stations, there are applications that require wide bandwidth transceivers, while others are focused on a narrower bandwidth. The transmitters in these designs may provide sufficient linearity, power, and signal-to-noise ratio across a wide variety of conditions. Effects such as differential non-linearity (DNL), integral non-linearity (INL), nonlinearity versus amplitude, correlated noise from supply and ground bounce, distortion, dispersion, and other effects are important to quantify and mitigate to meet the required specifications for the transmitter.

Figure 2:
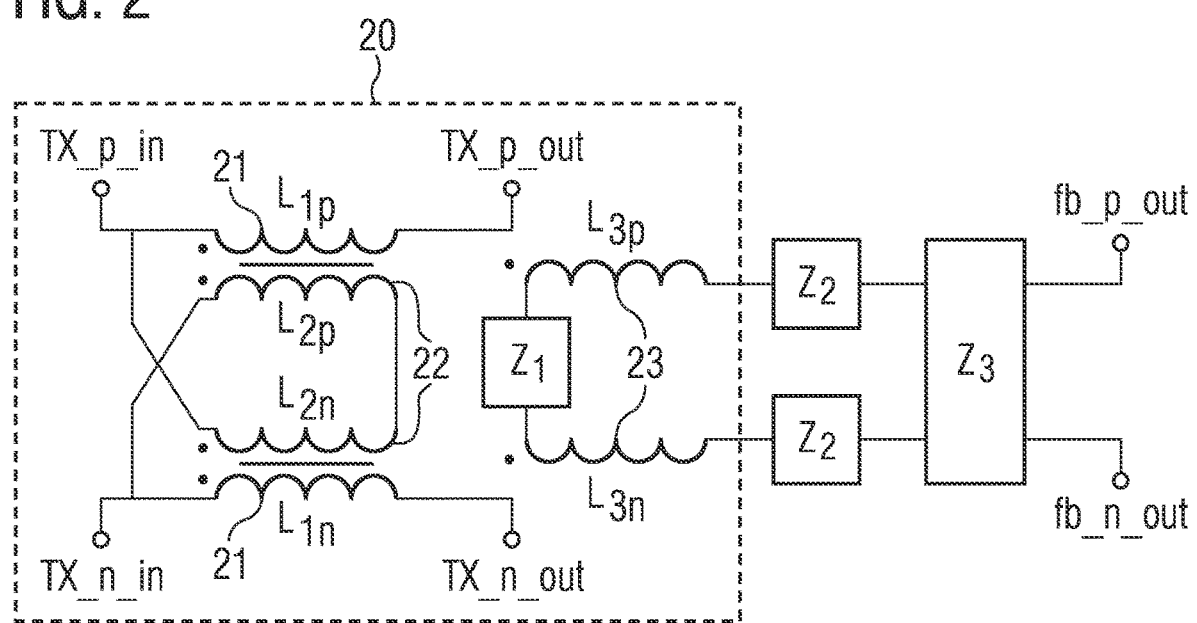
FIG. 2 shows an example of a transformer with a ternary coil and optional impedance network for implementing a high-performance feedback path.

Examples may reduce or even minimize a performance degradation to the transmitter by introducing a third coil (which can be referred to as ternary or trifilar coil) to a transformer along with the existing primary and secondary coils as shown in FIG. 2.

FIG. 2 shows a transformer 20 for a radio frequency transmitter circuit. The transformer 20 comprises a primary coil 21 and a secondary coil 22, which are configured to receive an input signal TX_p_in, TX_n_in and which are configured to provide an output signal. The transformer 20 further comprises a ternary coil 23 configured to provide a feedback signal.

The coils 21, 22, and 23 are inductors, loops, or conductor windings that generate an inductance. The coils 21, 22, and 23 are magnetically coupled as they are in their respective mutual magnetic fields. Hence, there are self-inductances and mutual inductances. For example, the transformer is configured to receive a balanced input signal and to provide an un-balanced output signal (balun configuration ("balanced to unbalanced")). The transformer may be used as an electrical device that converts between a balanced signal (differential) and an unbalanced signal (single-ended). A balun may be used for converting a differential (=balanced) input signal to a single-ended (=unbalanced) output signal, but in general can also be used for differential-in differential-out signal transfer, in general changing one or more electrical parameters (e.g. impedance level) between input and output port. While traditional transformers also provide DC-isolation by itself, transmission line baluns (or transformers, example: Guanella-type structure) do not, since input and output nodes are DC-coupled. If a balun is used with fully differential signals at input and output port, it may be more accurate to call it a transformer in general. In examples, both configurations are conceivable.

In the example shown in FIG. 2 the primary coil 21 is configured to receive a differential input signal, the secondary coil 22 is configured to provide a differential output signal, and the ternary coil 23 is configured to provide a differential feedback signal. The primary coil 21 in the example of FIG. 2 has an inductances $L_{1p}$ and $L_{1n}$ and the secondary coil has inductances $L_{2p}$ and $L_{2n}$.

As shown in FIG. 2 the electrical coupling of the primary and secondary coils 21 and 22 is configured in a way that the secondary coil 22 is coupled between the inputs TX_p_in, TX_n_in and the primary coil 21 has two separate windings, which are also coupled to the inputs TX_p_in, TX_n_in and which provide the outputs TX_p_out, TX_n_out. The coupling of the secondary coil 22 to the inputs TX_p_in, TX_n_in is twisted (crossing conductor lines) compared to the primary coil 21, such that the current in the primary and secondary coils in the geometry shown in FIG. 2 flows in opposite directions. In the example of FIG. 2 both, the primary coil 21 and the secondary coil 22, are configured to receive the input signal TX_p_in, TX_n_in and both are configured to provide the output signal TX_p_out, TX_n_out (through their magnetic coupling or mutual inductance).

In other examples, the primary coil 21 may be configured to receive the input signal and the secondary coil 22 may be configured to provide the output signal.

As can be further seen in FIG. 2 the ternary coil 23 is also magnetically coupled to the first and secondary coils 21, 22 and configured to provide the feedback signal fb_p_out, fb_n_out. In this example the ternary coil has inductances $L_{3p}$ and $L_{3n}$ and the feedback signal is a differential signal in line with the above description.

In other examples each of these inductors (primary coil 21, secondary coil 22, ternary coil 23) could be configured to receive or provide single-ended signals (input signal, output signal and feedback signal) and this could be in any combination. The same applies for the geometries and electrical coupling, for which several different configurations are conceivable. For example, for a power amplifier driving an antenna, the secondary side (secondary coil 22) of the output network is often single-ended. Examples are not restricted to any particular signal constellation. In further examples, the primary coil 21 may be configured to receive a differential or single-ended input signal, the secondary coil 22 may be configured to provide a single-ended output signal, and the ternary coil 23 may be configured to provide a differential or single-ended feedback signal.

For example, the primary coil 21 is configured to receive an amplified radio signal as input signal. The primary coil 21 may then be driven is driven by a CDAC as outlined above, by a mixer, or by a radio frequency (RF) power amplifier (PA). If the driver is a mixer, the signal might not be necessarily amplified but only frequency translated and eventually filtered. The primary coil 21 may be configured to receive an RF signal as input signal. For example, such an RF signal may have been generated by a mixer.

In the transformer 20 shown in FIG. 2 the primary coil 21 is configured to couple a first part of the power from the input signal to the secondary coil 22, from the input signal to the output signal, respectively. The primary coil 21 is further configured to couple a second part of the power from the input signal to the feedback signal, to the ternary coil 23, respectively. The second part of the power is less than a quarter of the first part of the power. This quota may apply if the transformer 20 is used after a CDAC as outlined with respect to FIG. 1. In other examples, where the transformer 20 may be used after power amplification the quota or ratio may be lower, e.g. the second part of the power may be less than 10%, 5%, 3%, 2%, or 1% percent of the first part of the power.

In examples the ternary coil 23 can be optimized in the inductance value such that it directly tunes the amplitude to the feedback ADC 14a to be in the correct range to optimize for ADC performance. Tuning the amplitude through the ratio of the inductance values in the primary coil 21 and secondary coil 22 versus the ternary coil 23 may provide a passive, nearly noiseless, distortion free technique of attenuating the feedback signal as needed. In addition, the ratio of the inductance values ($L_{1p}$, $L_{1n}$, $L_{2p}$, $L_{2n}$, $L_{3p}$, and $L_{3n}$) may also be used to provide an impedance transformation such that the effective resistance of the feedback loop, reflected back into the primary/secondary coils 21, 22, results in a reduced or even minimal change in the overall insertion loss and return loss in the actual forward transmitter path (towards the antenna). Moreover, as shown in FIG. 2 additional impedances $Z_1$, $Z_2$, and $Z_3$ may be used for impedance matching or filtering as will be detailed in the sequel.

The circuit of the transformer comprises a ternary coil 23, or third coil 23, that can be sized to balance the loading impact reflected into the Balun or transformer TX coil as well as signal amplitude. This coil 23, embedded in a feedback circuit, may be used to observe the current TX voltage during operation to collect data useful for enhancing the performance of the TX, e.g. during a dedicated training sequence or observing the actual TX-output during normal operation. The feedback circuit may also include other components for impedance, loading and amplitude control versus frequency, and RF filters.

The transformer or the circuit it is included in may enable a reduction in complexity of the TX design by relying on the feedback circuit to collect data on the linearity, distortion, and phase and magnitude changes across frequency of the TX across different conditions, to enhance the performance through either offline or real time control while minimizing or having only reduced loading impact of the observation circuit to improve or even maximize performance. The TX transformer 20 or Balun may be physically large although it may be implemented on a semiconductor chip or in a semiconductor package. For example, the physical dimensions of an example transformer 20 may be in range of hundreds of microns.

As outlined above another example is a transmitter circuit or device 10, e.g. one as shown in FIG. 1, comprising a transformer 20, e.g. inserted after the CDAC 12a, 14b to provide z as feedback signal. As already explained with respect to FIG. 1 such a transmitter circuit 10 may comprise a digital-to-analog-converter 12a, 14b, a transmit amplifier or a mixer with a transmit signal output. The primary coil 21 of the transformer 20 can then be coupled to the transmit signal output. The secondary coil 22 may be coupled to a transmit antenna path, for example, in a baseband signal path or an intermediate frequency (IF) path coupled to a mixer followed by the rest of the TX RF-chain. The ternary coil 23 is coupled to a feedback path of the transmitter circuit 10.

The transmitter circuit 10 may further comprise a pre-distortion circuit, which is coupled to the feedback path of the transmitter circuit and which is configured to determine pre-distortion information. As shown in FIG. 1 the pre-distortion circuit further comprises a pre-distortion device 12b, which is configured to pre-distort an input signal of the transmit amplifier, DAC, or mixer based on the pre-distortion information.

In line with FIG. 1, the feedback path may further comprise an analog-to-digital converter 14a. The ternary coil 23 may be coupled to the analog-to-digital converter using an impedance network $Z_1$, $Z_2$, and $Z_3$.

In examples, several other components may be added that improve the performance of the feedback, including the impedance networks $Z_1$, $Z_2$, and $Z_3$ as shown in the subsequent figures. The $Z_1$ and $Z_2$ impedances as in FIG. 2 may be passive components that are designed to provide an impedance match of the feedback network to the ADC load. In the following an on-chip implementation will be considered as a further example implementation. In such an example, a semiconductor chip may comprise an example of the transmitter circuit 10 and the transformer 20. The semiconductor chip further comprises, for example, a digital-to-analog converter configured to provide the input signal to the primary coil 21. Another example is a semiconductor package (made of multiple layers) with the transmitter circuit 10 and transformer 20. The primary and secondary coils 21, 22 may then be implemented on a different substrate than the ternary coil 23.

For example, a different substrate may refer to a different entity, constructed with a different fabrication process, e.g. chip substrate versus package substrate. If so, then close physical proximity for coupling may be guaranteed. For an on-chip (same substrate) implementation, an example construction is on different layers (of the same silicon substrate). If the entire TX-transformer/balun is constructed off-chip in the package substrate, the TX-feedback coil 23 may preferably be on a different metallization layer but residing in the same package substrate. For example, a transformer (primary and secondary coils 21, 22) may be on-chip, the ternary coil 23 may be off-chip, but in close physical proximity for coupling (e.g. ternary coil 23 on first or second metallization layer of package substrate, with the TX-transformer structure 21, 22 on the top metallization layer(s) of a TX-chip mounted face-down (flip-chip) on the package substrate, thus ensuring close vertical physical proximity between TX-transformer and ternary coil 23. The transformer 20 implementation is assumed to be as a balun in the following.

Figure 3:
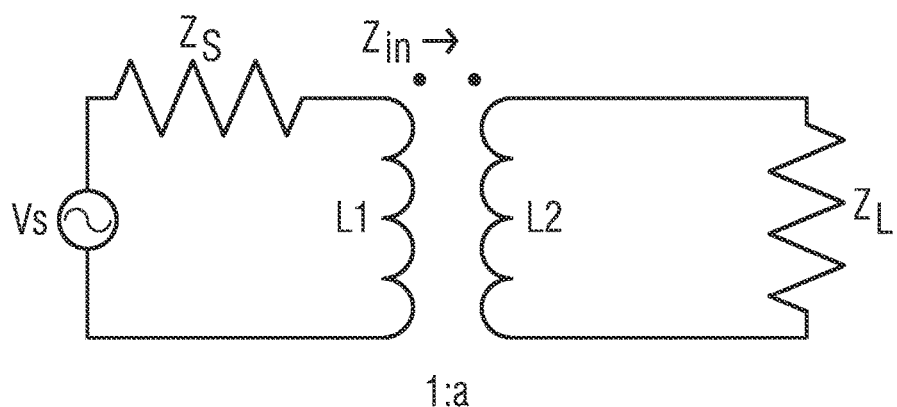
FIG. 3 shows transformer coils for ideal and non-ideal transformers.

Due to the finite k values (k determines the coupling) of the on-chip Balun, an impedance seen looking backwards into the Balun is highly frequency dependent and tends to increase with frequency due to the imperfect cancellation of the self-inductance by the mutual inductance. This can be seen from the equations 1 and 2 below and FIG. 3. FIG. 3 shows transformer coils for ideal and non-ideal transformers. FIG. 3 shows a primary coil with inductance of $L_1$ on the left and a secondary coil with inductance $L_2$ on the right. $Z_S$ is the impedance of the source, $Z_L$ is the impedance of the load, and $Z_{in}$ is the effective impedance seen at the input by the source $v_s$. Equation (1) is for an ideal transformer with ratio of primary to secondary windings of a, and the effective impedance can be constant versus frequency:

$$Z_{in} = \frac{1}{a^2} \cdot Z_L. \quad (1)$$

In a non-ideal transformer, described in equation (2), the impedance becomes frequency dependent due to the imperfect cancellation of the terms:

$$Z_{in} = sL_1 - \frac{s^2 M^2}{sL_2 + Z_L}, \quad (2)$$

wherein s represents the Laplacian parameter and M is the mutual inductance. Providing some reactance elements such as a resistor and capacitor in parallel, as shown in FIG. 4, can help to compensate and flatten the impedance versus frequency as shown in the example simulation results in FIG. 5 below.

Figure 4:
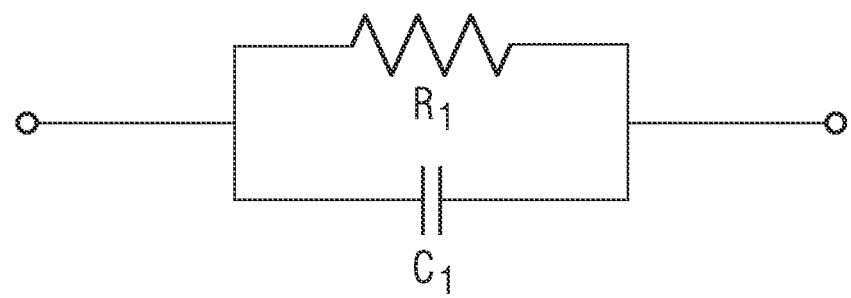
FIG. 4 shows an optional impedance matching network.
Figure 5:
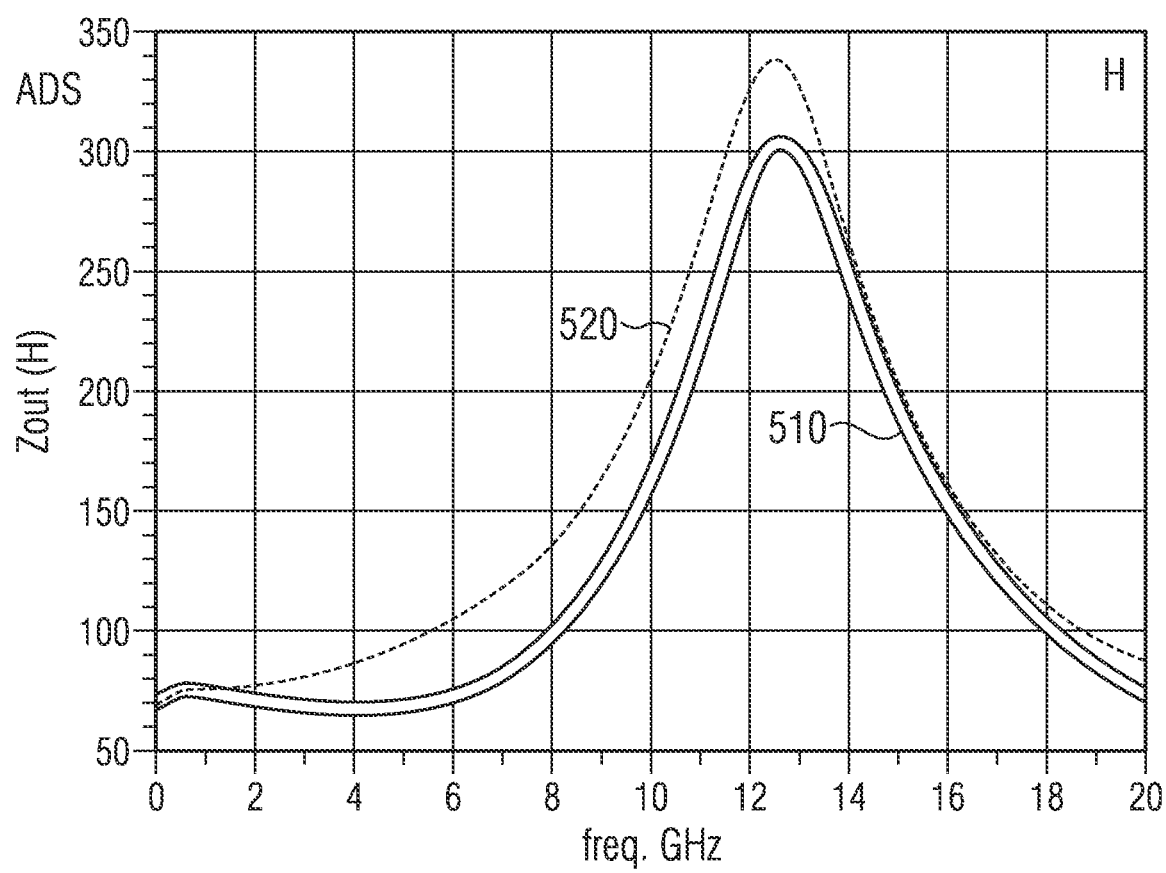
FIG. 5 shows impedance looking back into a ternary coil versus frequency with and without impedance matching reactance in $Z_2$ applied in series in an example implementation.

FIG. 4 shows an optional impedance matching network indicated by Z2 in FIG. 2. As an example, a capacitor with capacity $C_1$ is used in parallel to a resistor with resistance $R_1$. FIG. 5 shows the impedance $Z_{out}(H)$ when looking back into a ternary coil 23 versus frequency in GHz with (curve 510) and without (curve 520) impedance matching reactance in $Z_2$ applied in series in an example implementation. As can be seen from FIG. 5 with $Z_2$ the frequency dependency can be lowered (curve 510 lies below curve 520) and up until 6 Ghz the matched curve runs almost flat. Hence, in examples the impedance network may comprise passive impedance components which are configured to match an impedance of the ternary coil 23 to a load of the analog-to-digital converter 14a.

Figure 6:
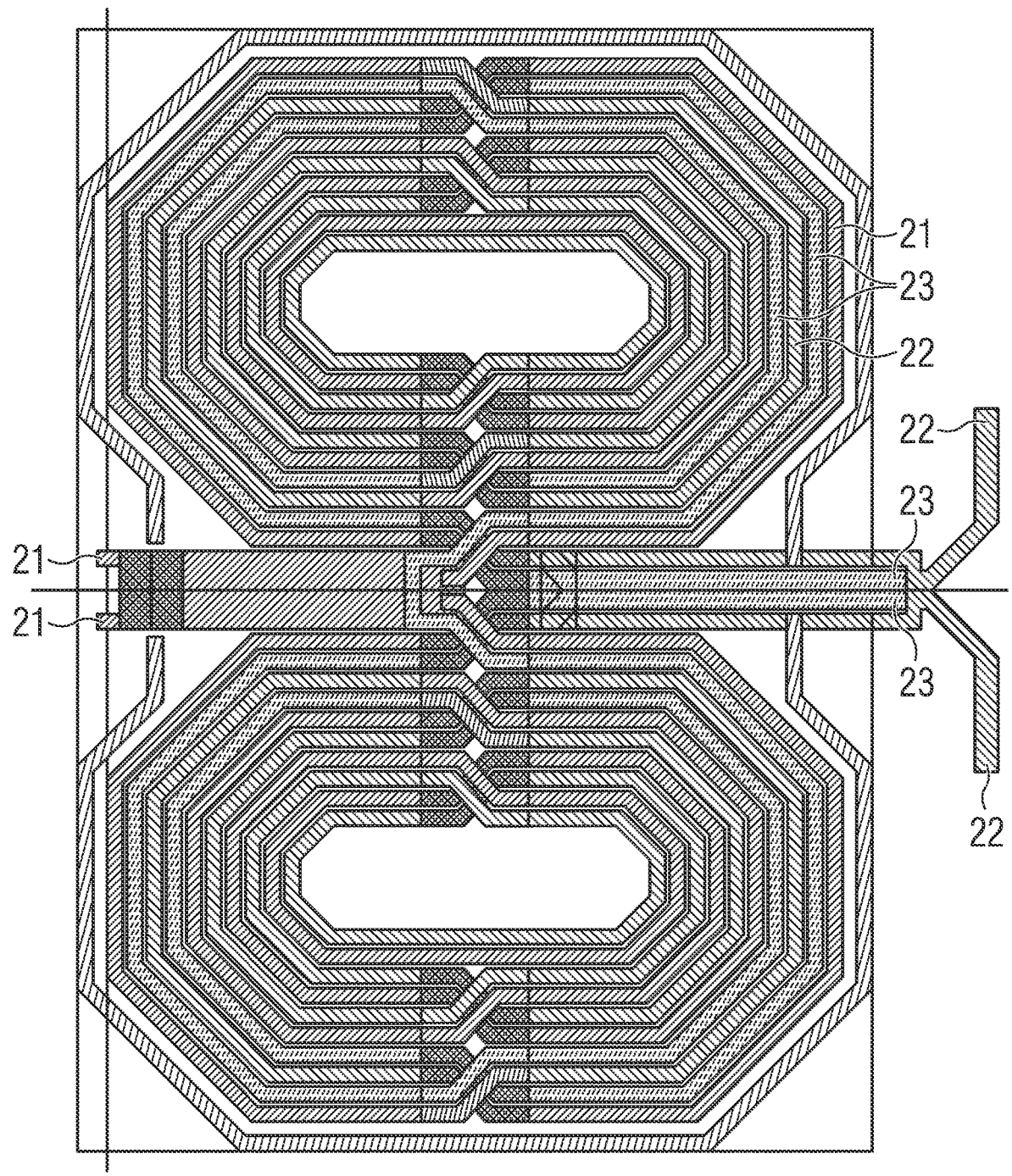
FIG. 6 shows an example layout of a differential Guanella Balun with primary, secondary, and ternary coils below.

FIG. 6 shows an example layout of a differential Guanella Balun with primary, secondary, and ternary coils 21, 22, 23. FIG. 6 shows a chip layout in which the primary coil 21 and the secondary coil 22 are on one layer and the ternary coil 23 is on another layer. In the projection plane shown in FIG. 6 all three coils 21, 22, 23 follow the shape of an 8, wherein the ternary coil 23 is an overlay with two windings, and the primary and secondary coils have more windings running in parallel through the 8-shape. The connectors to the coils are also indicated in FIG. 6.

Besides the impedance matching circuit, RF filters can be applied in $Z_3$ to eliminate digital quantization noise, unwanted spectral components that are not used or can potentially disturb the DPD-identification process, as well as for image rejection. Digital-to-analog conversion generates spectral replicas of the signal spectrum, which depend on the sampling rate. Typically, in case a signal bandwidth is $f_s$ and the sampling rate is $f_c$, a first replica occurs at $f_c-f_s$ and further replicas or images occur at $f_c+f_s$ and at $nf_c \pm f_s$, n being a positive integer multiplier. The impedance network may comprise an anti-aliasing filter configured to reduce spectral images. In a further example the impedance network comprises a filter, which is configured to reduce interfering radio frequency components in the feedback signal.

An analog filter after the ternary coil 23 may be intended to reduce aliasing products (spectral images) from the DAC due to its internal sampling process, or (in the case of a nonlinear RF-signal, e.g. a power amplifier output) unwanted signal frequency content that would disturb the operation of the feedback ADC (e.g. aliasing of unwanted spectral components due to the sampling operation in the front-end track-and-hold of the feedback ADC).

Figure 7:
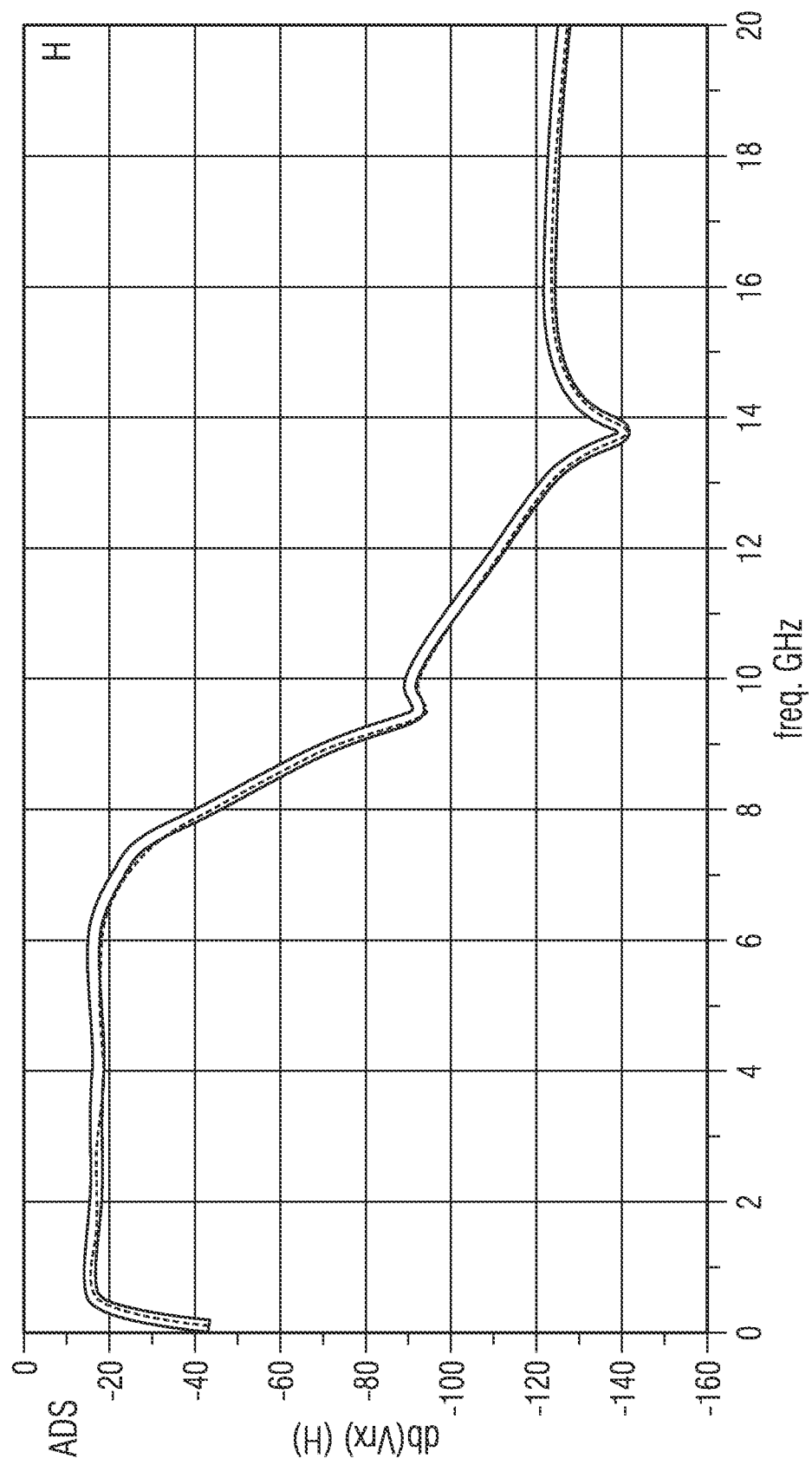
FIG. 7 shows simulation results of an output voltage transfer function derived from an example implementation that includes a balun, a ternary coil, $Z_1$, $Z_2$ for impedance flatting versus frequency, and a $Z_3$ low pass filter structure.

These RF filters typically may be impedance matched to both the source and load, which again can benefit from the $Z_2$ impedance structure in order to maintain a broadband frequency impedance match. An example transfer function is shown in FIG. 7 for the combined system proposed in FIG. 2. The impedance network comprises an anti-aliasing filter configured to reduce spectral images.

FIG. 7 shows simulation results of an output voltage transfer function derived from an example implementation that includes a balun, a ternary coil, $Z_1$, $Z_2$ for impedance flatting versus frequency, and a $Z_3$ low pass filter structure. As can be seen the transfer function up until 6 Ghz runs almost flat.

Figure 8:
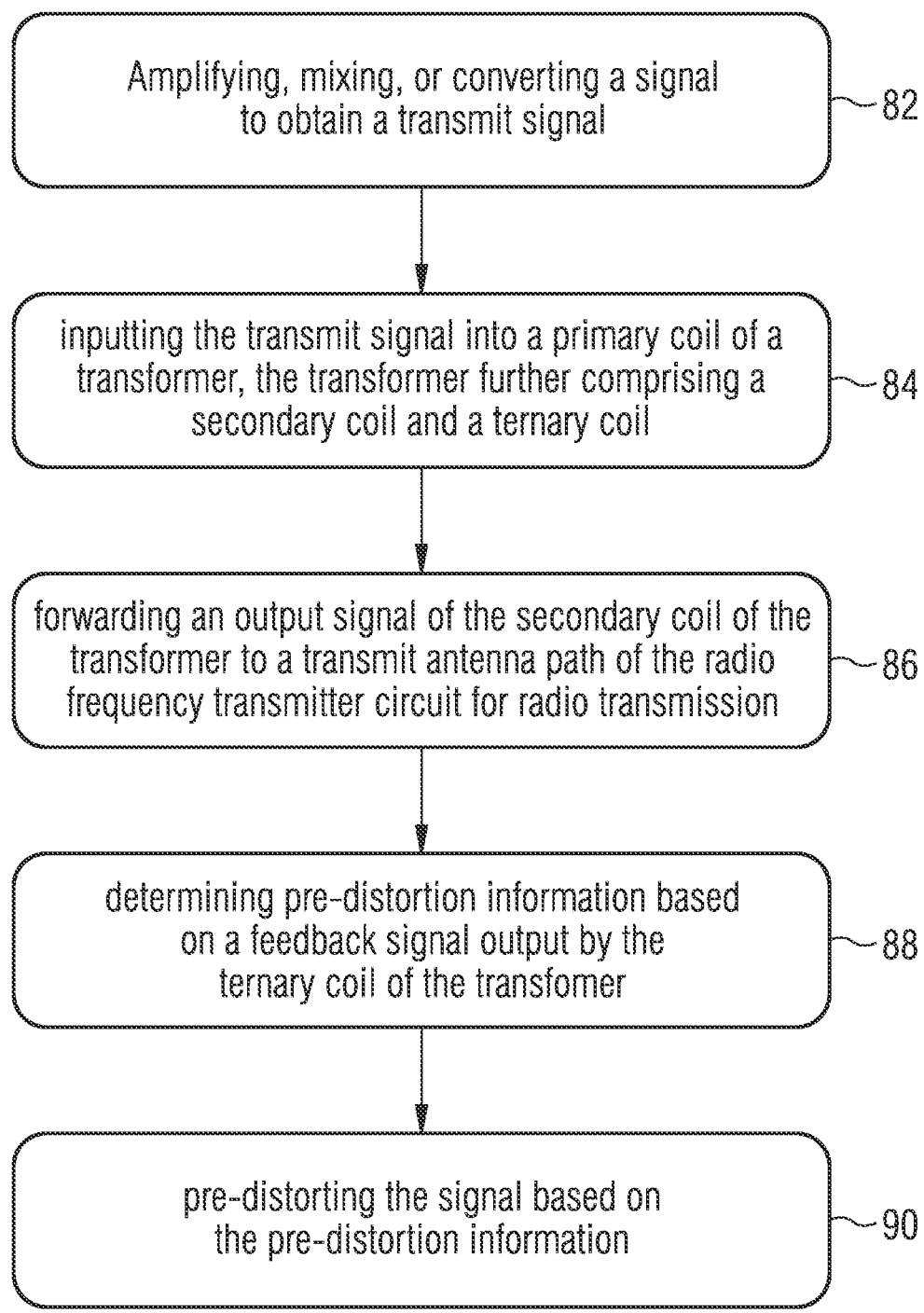
FIG. 8 shows a block diagram of an example of a method for a radio frequency transmitter circuit.

FIG. 8 shows a block diagram of an example of a method 80 for a radio frequency transmitter circuit. The method 80 comprises amplifying, mixing, or converting 82 a signal to obtain a transmit signal and inputting 84 the transmit signal into a primary coil of a transformer, the transformer further comprising a secondary coil and a ternary coil. The method further comprises forwarding 86 an output signal of the secondary coil of the transformer to a transmit antenna path of the radio frequency transmitter circuit for radio transmission, and determining 88 pre-distortion information based on a feedback signal output by the ternary coil of the transformer. The method 80 further comprises pre-distorting 90 the signal based on the pre-distortion information.

As outlined above the method 80 may further comprise filtering the feedback signal. The filtering may include any general type of analog filter. It could be specifically anti-alias filtering, and/or additional filtering of unwanted spectral content, possibly in addition to just specifically filtering out spectral images of the DAC.

A further example is a base station for a mobile communication system with the transmitter circuit 10. The base station may further comprise a DAC, a mixer, or an amplifier configured to provide the input signal to the primary coil. Another example is a mobile device or user equipment for a mobile communication system with the transmitter circuit 10. The mobile device may further comprise a DAC, a mixer, or an amplifier configured to provide the input signal to the primary coil.

In the following further implementation details on base stations, mobile devices, and transmit circuitry will be provided, which may comprise the above transformer 20 or transmit circuit 20.

Figure 9:
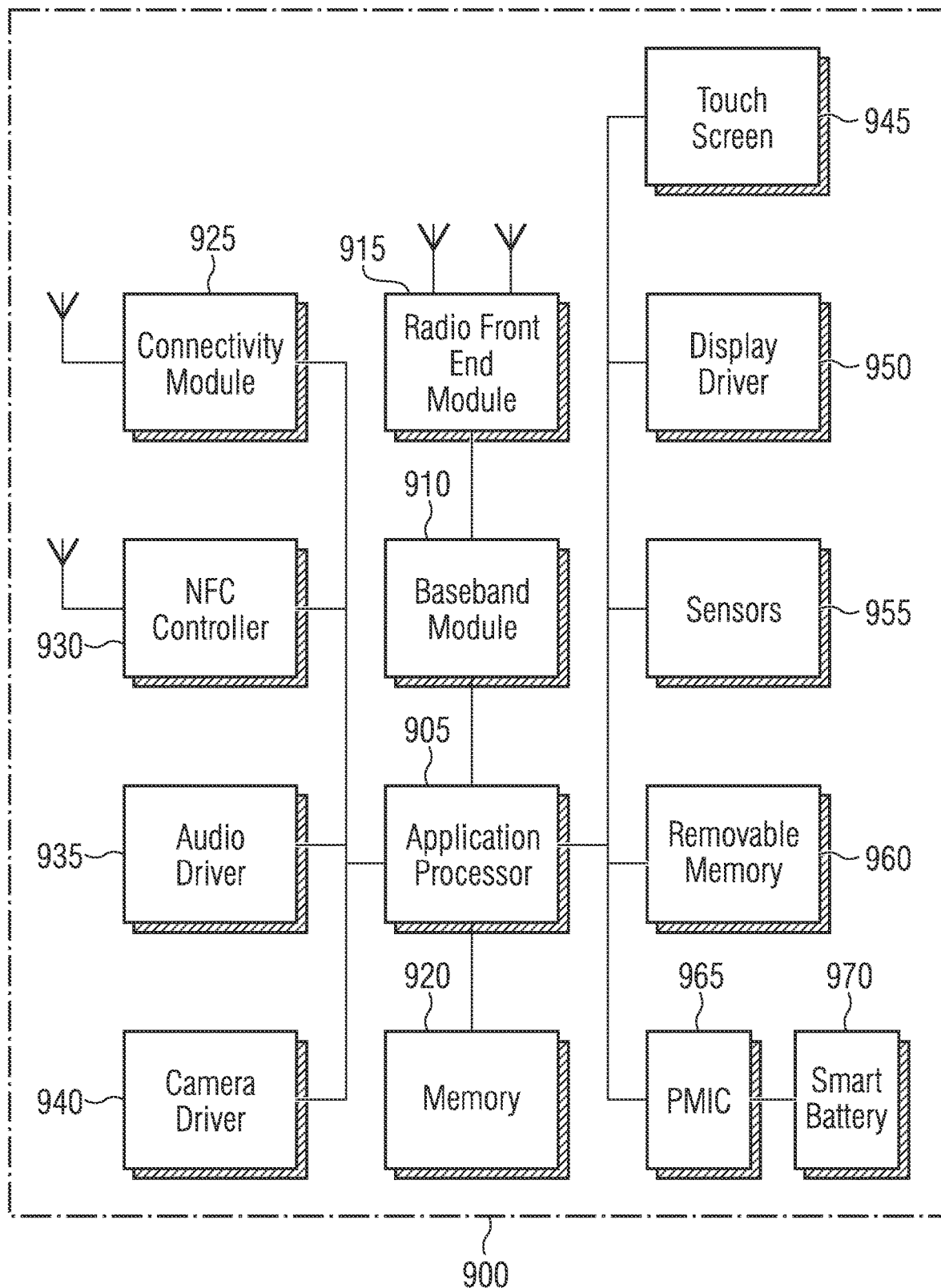
FIG. 9 shows an example of a mobile or user device.

FIG. 9 shows an example of a mobile or user device. FIG. 9 illustrates a user device 900 in accordance with an aspect. The user device 900 may be a mobile device in some aspects and includes an application processor 905, baseband processor 910 (also referred to as a baseband module), radio front end module (RFEM) 9115, memory 920, connectivity module 925, near field communication (NFC) controller 930, audio driver 935, camera driver 940, touch screen 945, display driver 950, sensors 955, removable memory 960, power management integrated circuit (PMIC) 965 and smart battery 970.

In some aspects, application processor 905 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 910 may be implemented, for example, as a solder-down substrate including one or more integrated circuits, a single packaged integrated circuit soldered to a main circuit board, and/or a multi-chip module containing two or more integrated circuits.

Figure 10:
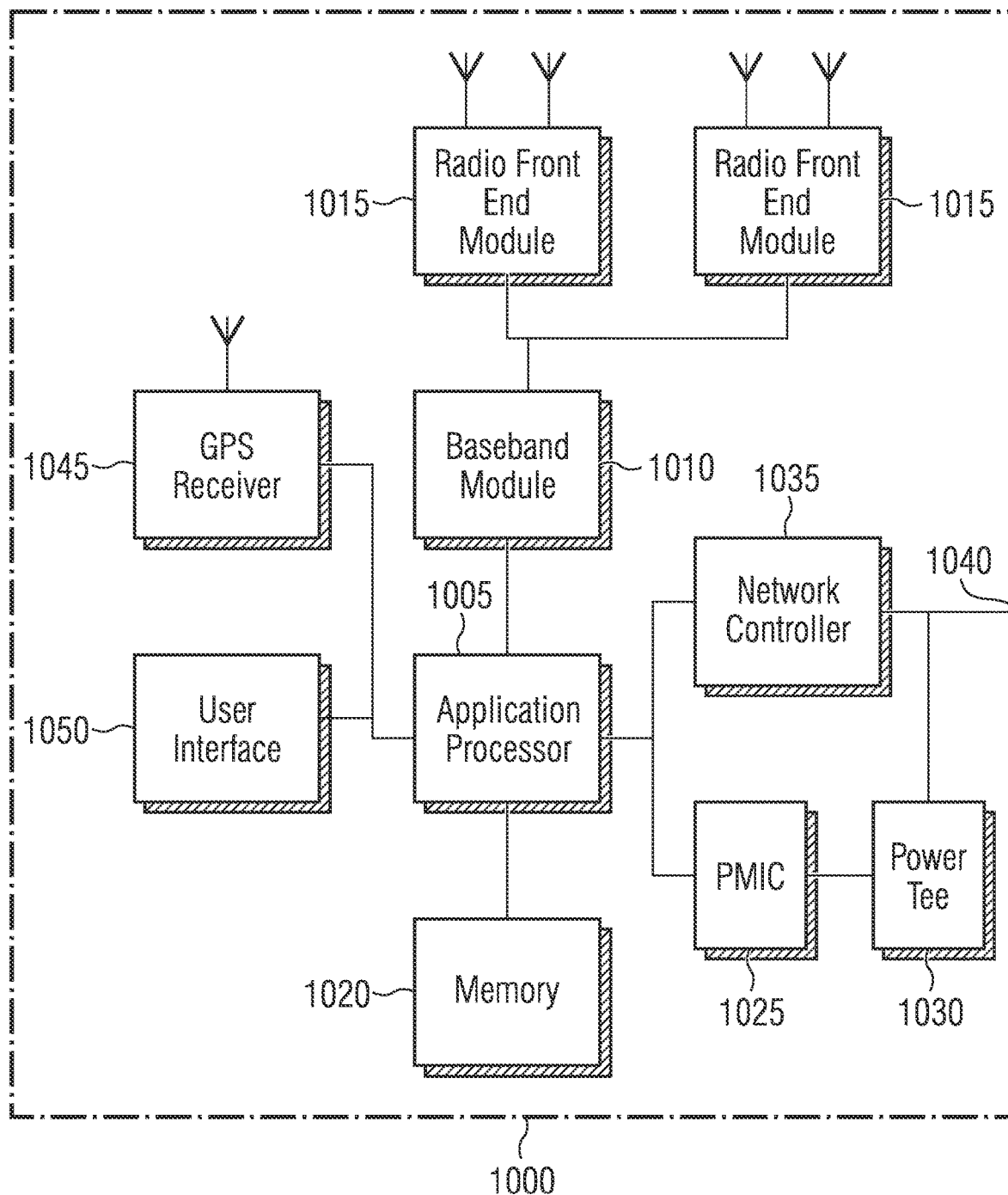
FIG. 10 shows an example of a base station or infrastructure equipment.

FIG. 10 shows an example of a base station or infrastructure equipment. FIG. 10 illustrates a base station or infrastructure equipment radio head 1000 in accordance with an aspect. The base station radio head 1000 may include one or more of application processor 1005, baseband modules 1010, one or more radio front end modules 1015, memory 1020, power management circuitry 1025, power tee circuitry 1030, network controller 1035, network interface connector 1040, satellite navigation receiver module 1045, and user interface 1050.

In some aspects, application processor 1005 may include one or more CPU cores and one or more of cache memory, low drop-out voltage regulators (LDOs), interrupt controllers, serial interfaces such as SPI, I2C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 1010 may be implemented, for example, as a solder-down substrate including one or more integrated circuits, a single packaged integrated circuit soldered to a main circuit board or a multi-chip module containing two or more integrated circuits.

In some aspects, memory 1020 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magnetoresistive random access memory (MRAM) and/or a three-dimensional crosspoint memory. Memory 1020 may be implemented as one or more of solder down packaged integrated circuits, socketed memory modules and plug-in memory cards.

In some aspects, power management integrated circuitry 1025 may include one or more of voltage regulators, surge protectors, power alarm detection circuitry and one or more back-up power sources such as a battery or capacitor. Power alarm detection circuitry may detect one or more of brown out (under-voltage) and surge (over-voltage) conditions.

In some aspects, power tee circuitry 1030 may provide for electrical power drawn from a network cable to provide both power supply and data connectivity to the base station radio head 1000 using a single cable.

In some aspects, network controller 1035 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 1045 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 1045 may provide data to application processor 1005 which may include one or more of position data or time data. Application processor 1005 may use time data to synchronize operations with other radio base stations.

In some aspects, user interface 1050 may include one or more of physical or virtual buttons, such as a reset button, one or more indicators such as light emitting diodes (LEDs) and a display screen.

Figure 11:
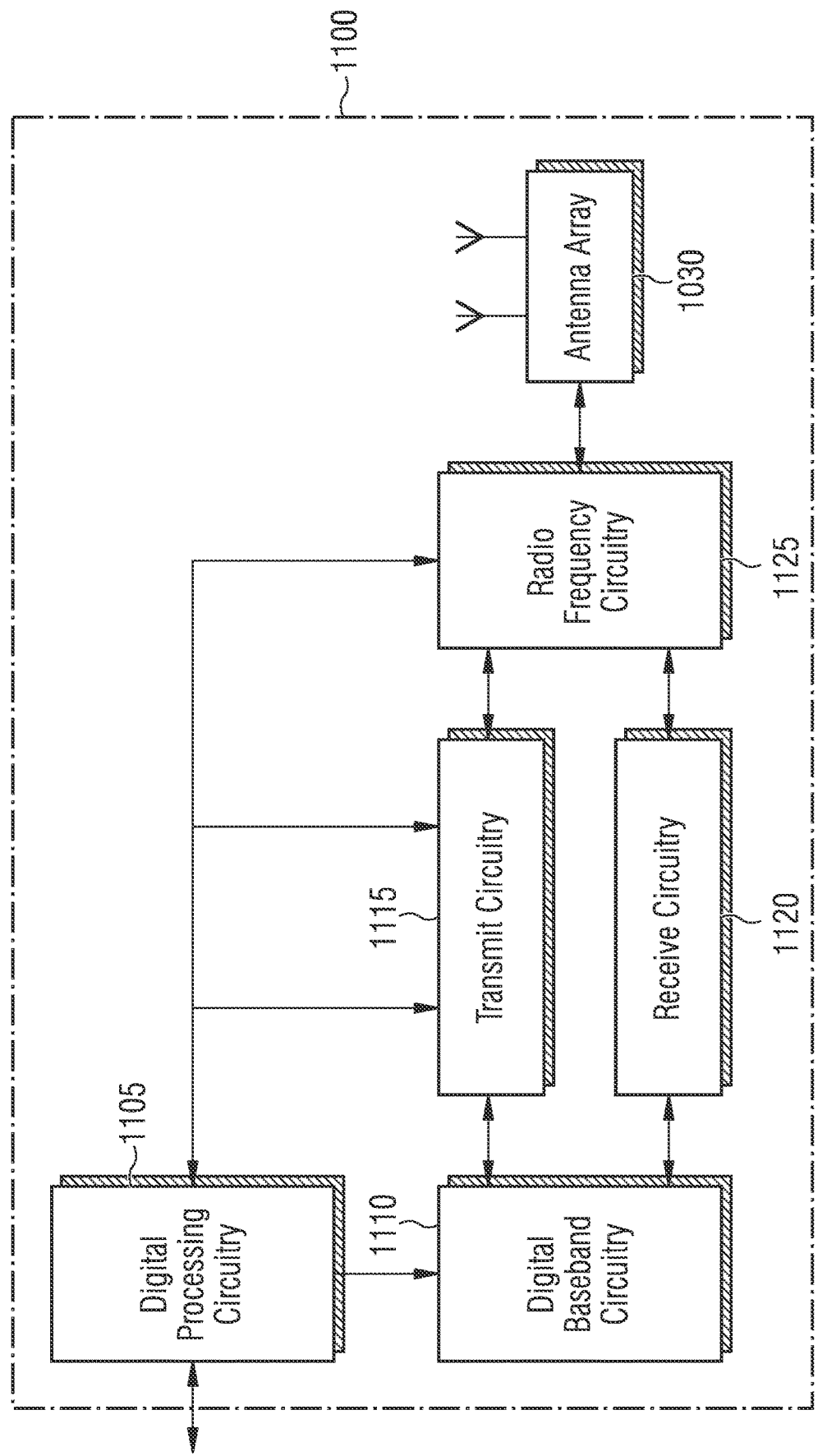
FIG. 11 shows an example of communication circuitry.

FIG. 11 shows an example of communication circuitry. FIG. 11 illustrates an exemplary millimeter wave communication circuitry 1100 according to some aspects. Circuitry 1100 is alternatively grouped according to functions. Components as shown in 1100 are shown here for illustrative purposes and may include other components not shown here in FIG. 11.

Millimeter wave communication circuitry 1100 may include protocol processing circuitry 1105, which may implement one or more of medium access control (MAC), radio link control (RLC), packet data convergence protocol (PDCP), radio resource control (RRC) and non-access stratum (NAS) functions. Protocol processing circuitry 1105 may include one or more processing cores (not shown) to execute instructions and one or more memory structures (not shown) to store program and data information.

Millimeter wave communication circuitry 1100 may further include digital baseband circuitry 1110, which may implement physical layer (PHY) functions including one or more of hybrid automatic repeat request (HARD) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Millimeter wave communication circuitry 1100 may further include transmit circuitry 1115, receive circuitry 1120 and/or antenna array circuitry 1130.

Millimeter wave communication circuitry 1100 may further include radio frequency (RF) circuitry 1125. In an aspect of the invention, RF circuitry 1125 may include multiple parallel RF chains for one or more of transmit or receive functions, each connected to one or more antennas of the antenna array 1130.

In an aspect of the disclosure, protocol processing circuitry 1105 may include one or more instances of control circuitry (not shown) to provide control functions for one or more of digital baseband circuitry 1110, transmit circuitry 1115, receive circuitry 1120, and/or radio frequency circuitry 1125.

Figure 12:
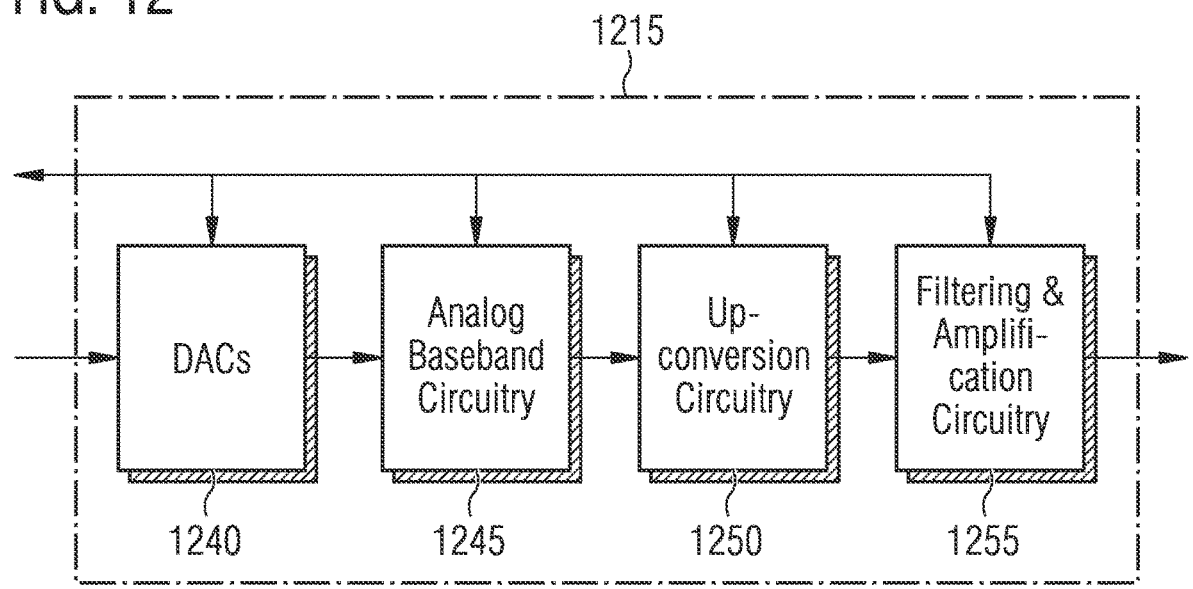
FIG. 12 shows examples for transmit circuitry.
Figure 12:
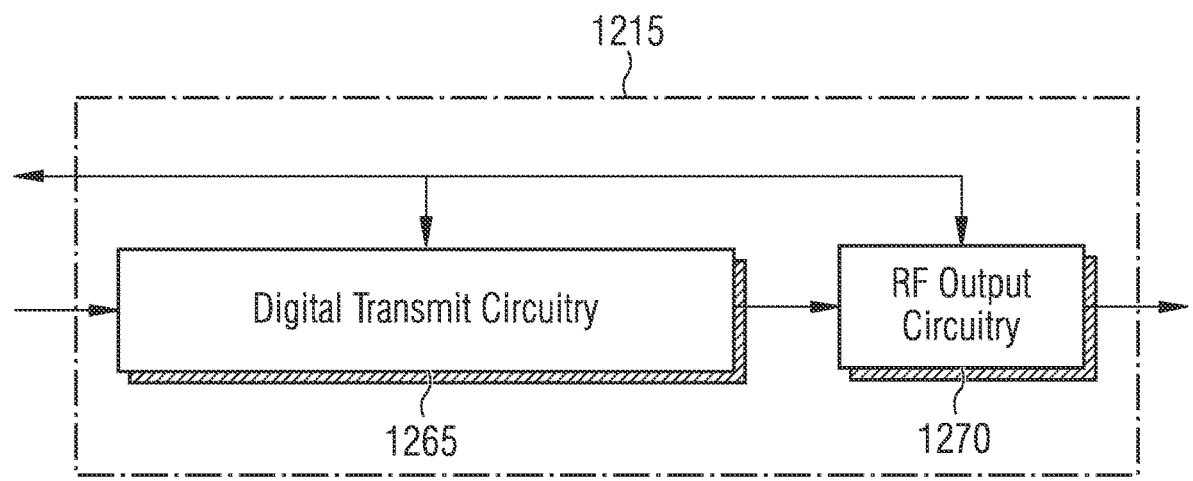

FIG. 12 shows examples for transmit circuitry. FIG. 12 at the top and FIG. 12 at the bottom illustrate examples for transmit circuitry 1215 in FIG. 11 in some aspects.

The exemplary transmit circuitry 1215 of FIG. 12 at the top may include one or more of digital to analog converters (DACs) 1240, analog baseband circuitry 1245, up-conversion circuitry 1250 and filtering and amplification circuitry 1255. In another aspect, FIG. 12 at the bottom illustrates an exemplary transmit circuitry 1215 which includes digital transmit circuitry 1265 and output circuitry 1270.

The following examples pertain to further embodiments.

Example 1 is a transformer for a radio frequency transmitter circuit, comprising a primary coil and a secondary coil, which are configured to receive an input signal and to provide an output signal; and a ternary coil configured to provide a feedback signal.

Example 2 is the transformer of example 1 being configured to receive a balanced input signal and to provide an un-balanced output signal.

Example 3 is the transformer of example 1 or 2, wherein the primary coil is configured to receive a differential input signal, wherein the secondary coil is configured to provide a differential output signal, and wherein the ternary coil is configured to provide a differential feedback signal.

Example 4 is the transformer of one of the examples 1 to 3, wherein the primary coil is configured to receive a differential or single-ended input signal, wherein the secondary coil is configured to provide a single-ended output signal, and wherein the ternary coil is configured to provide a differential or single-ended feedback signal.

Example 5 is the transformer of one of the examples 1 to 4, wherein the primary coil is configured to receive an amplified radio signal as input signal.

Example 6 is the transformer of one of the examples 1 to 5, wherein the primary coil is configured to receive a radio frequency signal as input signal.

Example 7 is the transformer of one of the examples 1 to 6, wherein the primary coil is configured to couple a first part of the power from the input signal output signal and wherein the primary coil is con-figured to couple a second part of the power from the input signal to the feedback signal, wherein the second part of the power is less than a quarter of the first part of the power.

Example 8 is the transformer of one of the examples 1 to 7, wherein the primary coil is configured to couple a first part of the power from the input signal to the output signal and wherein the primary coil is configured to couple a second part of the power from the input signal to the feedback signal, wherein the second part of the power is less than one 10% percent of the first part of the power.

Example 9 is a transmitter circuit comprising the transformer of one of the examples 1 to 8.

Example 10 is the transmitter circuit of example 9, further comprising a digital-to-analog-converter, a transmit amplifier, or a mixer with a transmit signal output, wherein the primary coil of the transformer is coupled to the transmit signal output, wherein the secondary coil is coupled to a transmit antenna path of the transmitter circuit, and wherein the ternary coil is coupled to a feedback path of the transmitter circuit.

Example 11 is the transmitter circuit of example 10, further comprising a pre-distortion circuit which is coupled to the feedback path of the transmitter circuit and which is configured to determine pre-distortion information.

Example 12 is the transmitter circuit of example 11, wherein the pre-distortion circuit further comprises a pre-distortion device, which is configured to pre-distort an input signal of the digital-to-analog-converter, the transmit amplifier, or the mixer transmit amplifier based on the pre-distortion information.

Example 13 is the transmitter circuit of example 10, wherein the feedback path further comprises an analog-to-digital converter.

Example 14 is the transmitter circuit of example 13, wherein the ternary coil is coupled to the analog-to-digital converter using an impedance network.

Example 15 is the transmitter circuit of example 14, wherein the impedance network comprises passive impedance components which are configured to match an impedance of the ternary coil to a load of the analog-to-digital converter.

Example 16 is the transmitter circuit of example 14, wherein the impedance network comprises an anti-aliasing filter configured to reduce spectral images.

Example 17 is the transmitter circuit of example 14, wherein the impedance network comprises a filter, which is configured to reduce interfering radio frequency components in the feedback signal.

Example 18 is a semiconductor chip with the transmitter circuit of example 9.

Example 19 is the semiconductor chip of example 18 further comprising a digital-to-analog converter configured to provide the input signal to the primary coil.

Example 20 is a semiconductor package with the transmitter circuit of example 9.

Example 21 is the semiconductor package of example 20, wherein the primary and secondary coils are implemented on a different substrate than the ternary coil.

Example 22 is a base station for a mobile communication system with the transmitter circuit of example 9.

Example 23 is the base station of example 22 further comprising a digital-to-analog converter, a mixer, or an amplifier configured to provide the input signal to the primary coil.

Example 24 is a mobile device for a mobile communication system with the transmitter circuit of example 9.

Example 25 is the mobile device of example 24, further comprising a digital-to-analog converter, a mixer, or an amplifier configured to provide the input signal to the primary coil.

Example 26 is a method for a radio frequency transmitter circuit, the method comprising amplifying, mixing, or converting a transmit signal to obtain an amplified transmit signal:

inputting the transmit signal into a primary coil of a transformer, the transformer further comprising a secondary coil and a ternary coil;

forwarding an output signal of the secondary coil of the transformer to a transmit antenna path of the radio frequency transmitter circuit for radio transmission;

determining pre-distortion information based on a feedback signal output by the ternary coil of the transformer; and pre-distorting the signal based on the pre-distortion information.

Example 27 is the method of example 26, further comprising filtering the feedback signal.

Example 28 is an apparatus for a radio frequency transmitter circuit, the apparatus comprising means for amplifying, mixing, or converting a signal to obtain a transmit signal:

means for inputting the transmit signal into a primary coil of a transformer, the transformer further comprising a secondary coil and a ternary coil;

means for forwarding an output signal of the secondary coil of the transformer to a transmit antenna path of the radio frequency transmitter circuit for radio transmission;

means for determining pre-distortion information based on a feedback signal output by the ternary coil of the transformer; and means for pre-distorting the signal based on the pre-distortion information.

Example 29 is the apparatus of example 28, further comprising means for filtering the feedback signal.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

The invention claimed is:

1. A transformer for a radio frequency transmitter circuit, comprising;
    a primary coil and a secondary coil, which are configured to receive an input signal and to provide an output signal; and
    a ternary coil configured to provide a feedback signal,
    wherein the primary coil is configured to couple a first part of the power from the input signal to the output signal and wherein the primary coil is configured to couple a second part of the power from the input signal to the feedback signal, wherein the second part of the power is less than a quarter of the first part of the power.

2. The transformer of claim 1, being configured to receive a balanced input signal and to provide an un-balanced output signal.

3. The transformer of claim 1, wherein the primary coil is configured to receive a differential input signal, wherein the secondary coil is configured to provide a differential output signal, and wherein the ternary coil is configured to provide a differential feedback signal.

4. The transformer of claim 1, wherein the primary coil is configured to receive a differential or single-ended input signal, wherein the secondary coil is configured to provide a single-ended output signal, and wherein the ternary coil is configured to provide a differential or single-ended feedback signal.

5. The transformer of claim 1, wherein the primary coil is configured to receive an amplified radio signal as input signal.

6. The transformer of claim 1, wherein the primary coil is configured to receive a radio frequency signal as input signal.

7. The transformer of claim 1, wherein the primary coil is configured to couple a first part of the power from the input signal to the output signal and wherein the primary coil is configured to couple a second part of the power from the input signal to the feedback signal, wherein the second part of the power is less than one 10% percent of the first part of the power.

8. A transmitter circuit comprising; the transformer of claim 1.

9. The transmitter circuit of claim 8, further comprising a digital-to-analog-converter, a transmit amplifier, or a mixer with a transmit signal output, wherein the primary coil of the transformer is coupled to the transmit signal output, wherein the secondary coil is coupled to a transmit antenna path of the transmitter circuit, and wherein the ternary coil is coupled to a feedback path of the transmitter circuit.

10. The transmitter circuit of claim 9, further comprising a pre-distortion circuit which is coupled to the feedback path of the transmitter circuit and which is configured to determine pre-distortion information.

11. The transmitter circuit of claim 10, wherein the pre-distortion circuit further comprises a pre-distortion device, which is configured to pre-distort an input signal of the digital-to-analog-converter, the transmit amplifier, or the mixer based on the pre-distortion information.

12. The transmitter circuit of claim 9, wherein the feedback path further comprises an analog-to-digital converter.

13. The transmitter circuit of claim 12, wherein the ternary coil is coupled to the analog-to-digital converter using an impedance network.

14. The transmitter circuit of claim 13, wherein the impedance network comprises passive impedance components which are configured to match an impedance of the ternary coil to a load of the analog-to-digital converter.

15. The transmitter circuit of claim 13, wherein the impedance network comprises an anti-aliasing filter configured to reduce spectral images.

16. The transmitter circuit of claim 13, wherein the impedance network comprises a filter, which is configured to reduce interfering radio frequency components in the feedback signal.

17. A semiconductor chip with the transmitter circuit of claim 8.

18. The semiconductor chip of claim 17 further comprising a digital-to-analog converter configured to provide the input signal to the primary coil.

19. A semiconductor package with the transmitter circuit of claim 8.

20. The semiconductor package of claim 19, wherein the primary and secondary coils are implemented on a different substrate than the ternary coil.

21. A base station for a mobile communication system with the transmitter circuit of claim 8.

22. The base station of claim 21 further comprising a digital-to-analog converter, a mixer, or an amplifier configured to provide the input signal to the primary coil.

23. A mobile device for a mobile communication system with the transmitter circuit of claim 8.

24. The mobile device of claim 23, further comprising a digital-to-analog converter, a mixer, or an amplifier configured to provide the input signal to the primary coil.

25. A method for a radio frequency transmitter circuit, the method comprising
- amplifying, mixing, or converting a signal to obtain a transmit signal;
- inputting the transmit signal into a primary coil of a transformer, the transformer further comprising a secondary coil and a ternary coil;
- forwarding an output signal of the secondary coil of the transformer to a transmit antenna path of the radio frequency transmitter circuit for radio transmission;
- determining pre-distortion information based on a feedback signal output by the ternary coil of the transformer; and
- pre-distorting the signal based on the pre-distortion information.

26. The method of claim 25, further comprising filtering the feedback signal.

\* \* \* \* \*